(12) United States Patent
Or et al.

(10) Patent No.: US 7,227,295 B2
(45) Date of Patent: Jun. 5, 2007

(54) PIEZOELECTRIC DEVICE WITH AMPLIFYING MECHANISM

(75) Inventors: Siu Wing Or, Hong Kong (CN); Chung Shueng Yung, Hong Kong (CN); Lai Wa Helen Chan-Wong, Hong Kong (CN); Ping Kong Joseph Choy, Hong Kong (CN); Chou Kee Peter Liu, Hong Kong (CN)

(73) Assignee: ASM Assembly Automation Ltd., Hong Kong (CN)

( * ) Notice: Subject to any disclaimer, the term of this patent is extended or adjusted under 35 U.S.C. 154(b) by 282 days.

(21) Appl. No.: 11/051,091

(22) Filed: Feb. 4, 2005

(65) Prior Publication Data

US 2006/0175934 A1 Aug. 10, 2006

(51) Int. Cl.
*H01L 41/08* (2006.01)
(52) U.S. Cl. .................................................. 310/328
(58) Field of Classification Search ................ 310/328, 310/330–332, 369, 325, 311, 337; 367/167; *H01L 41/08*
See application file for complete search history.

(56) References Cited

U.S. PATENT DOCUMENTS

| 6,927,528 | B2 * | 8/2005 | Barillot et al. | 310/328 |
| 6,992,422 | B2 * | 1/2006 | Heaton et al. | 310/331 |
| 2004/0140737 | A1 * | 7/2004 | Barillot et al. | 310/328 |

* cited by examiner

*Primary Examiner*—Tom Dougherty
*Assistant Examiner*—Karen Addison
(74) *Attorney, Agent, or Firm*—Ostrolenk, Faber, Gerb & Soffen, LLP

(57) ABSTRACT

A piezoelectric device is provided that comprises a mechanical amplifier adapted to produce a displacement output and/or receive a force input, and first and second flexible platforms connected to the mechanical amplifier. The first flexible platform is connected to one side of the mechanical amplifier and piezoelectric material is mounted on the first flexible platform for controllably flexing the first flexible platform. The second flexible platform is connected to another side of the mechanical amplifier and piezoelectric material is mounted to the second flexible platform for controllably flexing the second flexible platform.

23 Claims, 12 Drawing Sheets
(12 of 12 Drawing Sheet(s) Filed in Color)

PIEZOELECTRIC DEVICE WITH AMPLIFYING MECHANISM

FIELD OF THE INVENTION

The invention relates to piezoelectric devices, and in particular to piezoelectric devices having structures that include mechanical amplifiers. The piezoelectric devices are suitable for use in a variety of applications, such as for actuation, force sensing and/or sensoriactuation.

BACKGROUND AND PRIOR ART

Actuators are extensively used in mechanical, electronic and optical systems like positioning lenses in telescopes, focusing in microscopes or vibration suppression in dedicated equipment. Traditional actuation by pneumatic, hydraulic or electromagnetic means cannot fulfill modern machinery requirements in terms of response time, frequency, resolution and size. Thus, several classes of actuators using piezoelectric, magnetostrictive and shape memory alloy smart materials have been developed for these applications.

The construction of these actuators is usually based on bulky, fragile and expensive smart material elements like piezoelectric multilayer stacks and complex and expensive mechanical amplifiers, which make these actuators vulnerable to damage and very complex and expensive. Among the piezoelectric actuators, unimorph/multi-morph type devices as illustrated in FIG. 1(a) are the most competitive in terms of size, weight, cost, reliability and manufacturing. These kinds of devices 100 comprise alternating layers of piezoelectric materials 102 and substrate materials 104 bonded together or grown by sputtering/chemical processes. The piezoelectric materials 102 are mostly piezoelectric ceramics and the substrate materials 104 can be made of metals, polymers, ceramics or their composites. When an electrical signal is applied across the piezoelectric materials, the piezoelectric materials change their shapes, causing the multiple layers of materials to deform. Additionally, these types of devices can also generate electrical signals when loads are applied on them. This two-way capability makes these unimorph/multi-morph devices suitable for use as actuators, sensors and/or sensoriactuators. Unimorph/multi-morph devices are well known to be capable of providing large displacement output. However, their blocked forces are relatively small due to their small flexural strength, and their applications are generally limited to those requiring smaller loading.

An example of a type of piezoelectric actuator is described in U.S. Pat. No. 4,760,570 entitled "Piezo-Electric Device". The patent describes a device with piezoelectric ceramic plates sandwiching an intermediate plate. The device is used as a vibration source for delivering vibrational motions. However, it has a limited loading capacity, as explained above. Another example of a prior art piezoelectric actuator is described in U.S. Pat. No. 4,952,835 entitled, "Double Saggital Push Stroke Amplifier". This patent describes a mechanism that is applicable in high performance piezoelectric actuators. The geometric profile of this device resulting from its amplification scheme can provide a relatively high displacement output and higher forces when a piezoelectric ceramic multilayer stack is used. Nevertheless, it is vulnerable to damage and is expensive to produce.

To achieve higher loading, a descendent of the unimorph devices, such as a descendent device 106 shown in FIG. 1(b) utilizes a dome-shaped architecture wherein a piezoelectric material 102 is bonded to a curved substrate 108 formed at elevated temperatures. The curvature is inherently a compact mechanical amplifier which provides the device with comparably higher displacement and force output than unimorph/multimorph devices. Such architecture is described, for example, in U.S. Pat. No. 6,734,603 entitled "Thin Layer Composite Unimorph Ferroelectric Driver and Sensor".

Although this descendent device 106 possesses better performance, it suffers from installation problems due to its inherent curvature which makes the device performance sensitive to mounting. Reliability of the device under operation is also worsened due to the concentrated loading on the curved surface of the device, which induces stress concentration and rubbing on the brittle piezoelectric ceramic layers. Thus, it requires extra peripheral components specially designed for the descendent device if the device has to be coupled to an external object.

SUMMARY OF THE INVENTION

It is therefore an object of the invention to seek to provide an improved piezoelectric device that overcomes some of the disadvantages associated with the aforesaid prior art devices.

Accordingly, the invention provides a piezoelectric device comprising: a mechanical amplifier adapted to produce a displacement output and/or receive a force input; a first flexible platform connected to one side of the mechanical amplifier; piezoelectric material mounted on the first flexible platform for controllably flexing the first flexible platform; a second flexible platform connected to another side of the mechanical amplifier; and piezoelectric material mounted to the second flexible platform for controllably flexing the second flexible platform.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The patent or application file contains at least one drawing executed in color. Copies of this patent or patent application publication with color drawings will be provided by the Office upon request and payment of the necessary fee.

Examples of preferred embodiments of piezoelectric devices in accordance with the invention will now be described with reference to the accompanying drawings, in which.

DETAILED DESCRIPTION OF THE PREFERRED EMBODIMENTS

Figure 1A:
FIGS. 1(a) and 1(b) are cross-sectional views of basic constructions of prior art piezoelectric devices.
Figure 1B:
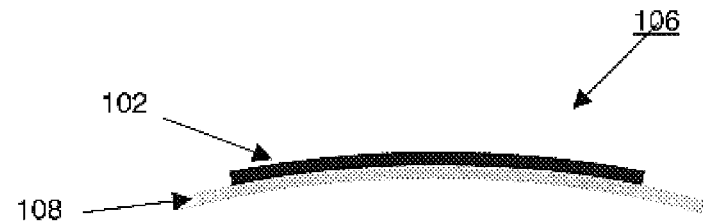

Various embodiments of piezoelectric devices according to the present invention are hereinafter described with reference to the drawings. However, the invention is not limited to such embodiments illustrated in the drawings.

In the following description, the term "piezoelectric materials" refers to those materials that can change their shapes in response to an electrical signal and can respond to an applied load by producing an electrical signal. These piezoelectric materials are preferably but not exclusively piezoelectric ceramics, such as lead zirconate titanate (PZT), barium titanate ($BaTiO_3$), lead magnesium niobate-lead titanate (PMN-PT) and lead zirconate niobate-lead titanate (PZN-PT).

Figure 2:
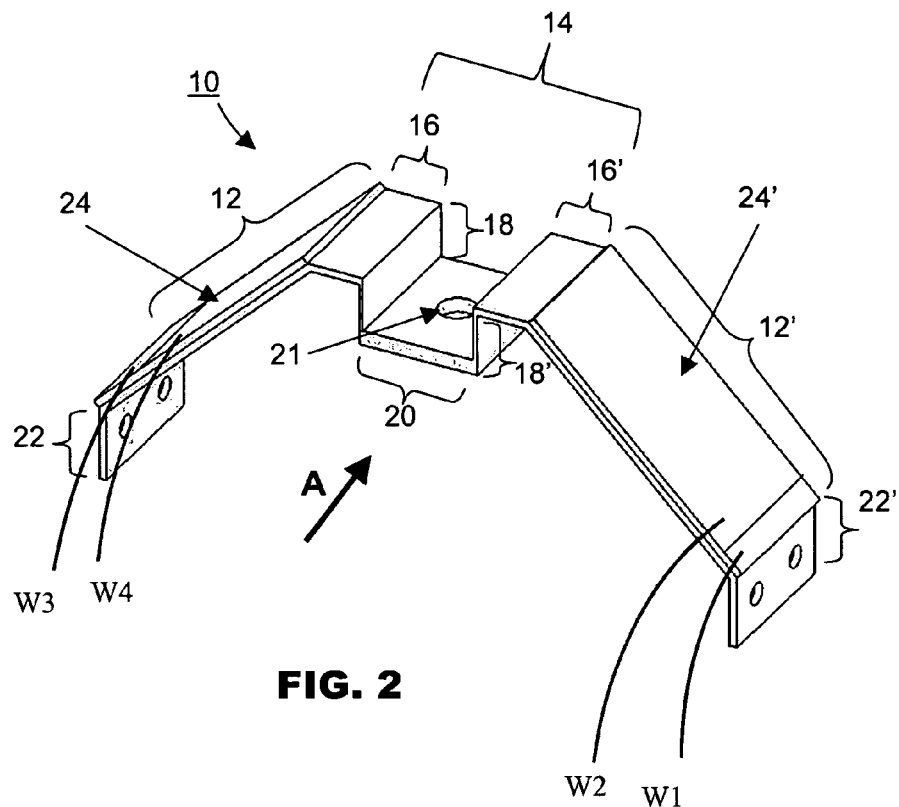
FIG. 2 is an isometric view of a piezoelectric device according to a first preferred embodiment of the present invention.

FIG. 2 is an isometric view of a piezoelectric device 10 according to a first preferred embodiment of the present invention. The piezoelectric device 10 is constructed with a mechanical amplifier in the form of a saddle-like amplifying structure 14 and driving parts comprising a first flexible platform connected to one side of the saddle-like amplifying structure 14 such as inclined link 12, a second flexible platform connected to another side of the saddle-like amplifying structure such as inclined link 12' for bonding drivers. The drivers are preferably in the form of piezoelectric materials 24, 24' that are mounted onto the inclined links 12, 12' for controllably flexing the inclined links 12, 12'. The inclined links 12, 12' are preferably inclined at an oblique angle to the saddle-like amplifying structure 14. In the preferred embodiments of the invention, the saddle-like amplifying structure 14 is a symmetrical saddle-like substrate, wherein the inclined links 12, 12' are arranged on opposite sides of the saddle-like amplifying structure 14 and are positioned symmetrically about the saddle-like amplifying structure 14.

The saddle-like amplifying structure 14 may be made from a monolithic high strength metallic material such as stainless steels, titanium alloys, aluminum alloys, or the like. Although these materials provide excellent performance, the use of other materials for the saddle-like amplifying structure 14 can also be appropriate depending on the application. A single piece of metallic material can form the saddle-like structure 14 as shown in FIG. 2 through folding a strip of the material, wire-cutting of bulk material, sintering of metallic powder or other machining processes. The inclined links 12, 12' and mounting flanges 22, 22' that are arranged symmetrically on opposite sides of the saddle-like amplifying structure 14 may also be made from the same piece of metallic material, or separately joined to the saddle-like amplifying structure 14. The mounting flanges 22, 22' serve to mount the piezoelectric device 10 to a generally fixed structure.

The saddle-like amplifying structure 14 preferably consists of amplifying levers 16, 16' connected to the inclined links 12, 12', flexural links 18, 18' and a central or mounting seat 20. The flexural links 18, 18' link the amplifying levers 16, 16' to the mounting seat 20. Most preferably, the amplifying levers 16, 16' are arranged substantially orthogonally to the flexural links 18, 18' and the flexural links 18, 18' are arranged substantially orthogonally to the mounting seat 20. Mounting means, such as a mounting hole 21, may be located on the mounting seat 20 so that an object can be mounted to the saddle-like amplifying structure 14. The thickness of the metallic substrate of the driving part is matched to the mechanical and geometrical properties of the piezoelectric materials 24, 24' for achieving maximum power transfer. The thickness ratio of the metallic substrate to piezoelectric materials may range from 0.3 to 1.5.

Figure 3:
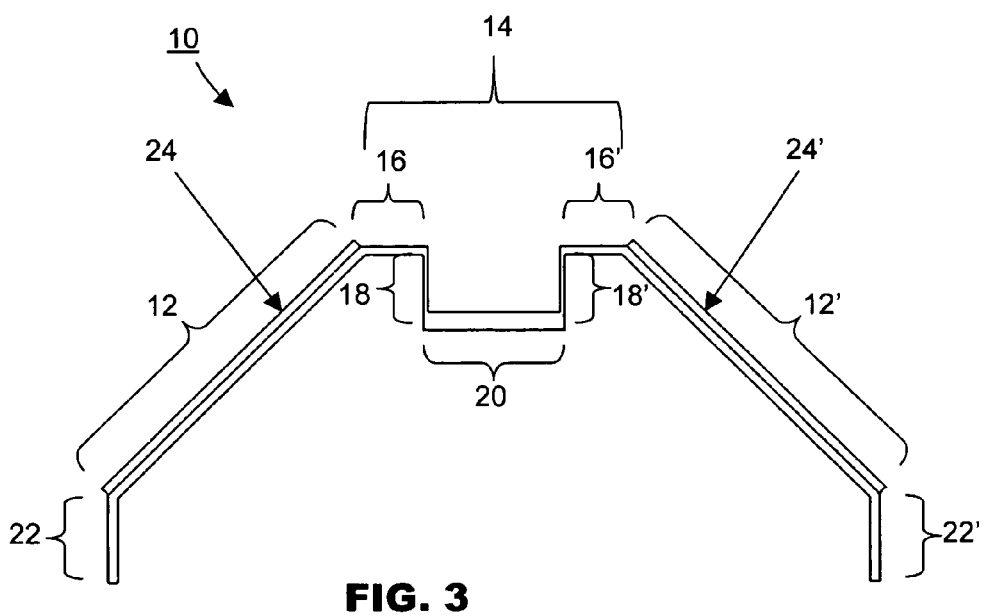
FIG. 3 is a front view of the piezoelectric device shown in FIG. 2 looking from direction A of FIG. 2.

Piezoelectric materials 24, 24' with large piezoelectric constants and electrodes coated on both sides are epoxy bonded or chemically/physically deposited onto the inclined links 12, 12' to form unimorph/multi-morph-like driving parts. Electrical wires W1, W2, W3 and W4 are welded or bonded onto the piezoelectric materials 24, 24' to electrically connect the piezoelectric materials 24, 24' to an electrical source. The flexural links 18, 18' are made thinner than that of amplifying levers 16, 16' and mounting seat 20 to enhance their flexibility. The amplifying levers 16, 16' and mounting seat 20 thus form a rigid link when the driving part comprising the inclined links 12, 12' and piezoelectric materials 24, 24' deforms. The said mounting flanges 22, 22', driving part, amplifying levers 16, 16', flexural links 18, 18' and mounting seat 20 thus form the unitary structure of the piezoelectric device 10. FIG. 3 is a front view of the piezoelectric device shown in FIG. 2 looking from direction A of FIG. 2.

Figure 4:
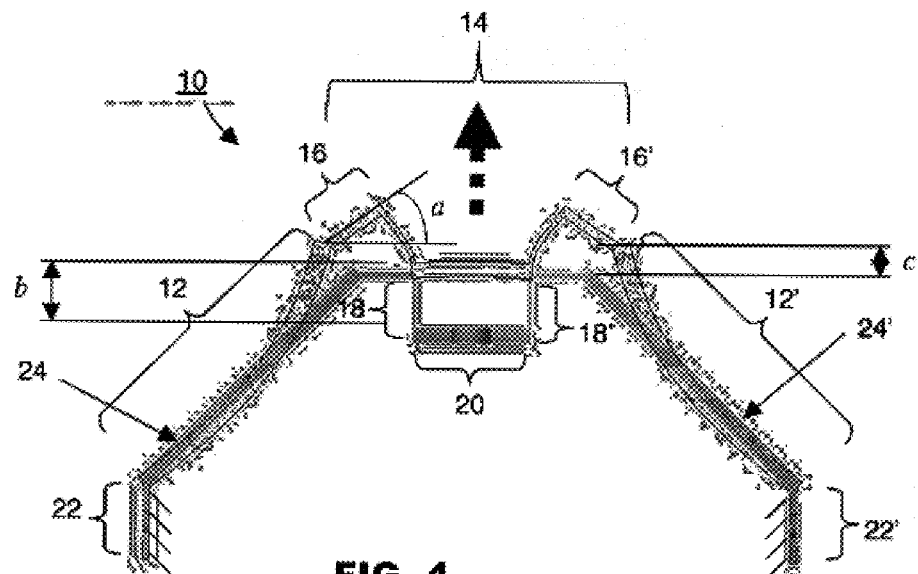
FIG. 4 is a schematic explanatory view illustrating an operational state of the first preferred embodiment of the piezoelectric device.

FIG. 4 is a schematic explanatory view illustrating an operational state of the first preferred embodiment of the piezoelectric device 10. It shows the deformation of the driving part of the device 10 when the said piezoelectric materials 24, 24' are energized by an electrical source (not shown) such that the piezoelectric materials 24, 24' bonded onto the said inclined links 12, 12' contract (or expand), resulting in bending-out (or bending-in) of the said driving part. At rest, the central portion of the saddle-like amplifying structure 14 comprising the mounting seat 20 is notionally located on a plane. The bending of the driving part causes a rotation a as well as a deflection c at the junction connecting the driving part to the amplifying levers 16, 16'. An output stroke b of the device is thus related to the length of the amplifying levers 16, 16', the rotation angle a of the driving part tip and the deflection c of the driving part. They are controllable by controlling the degree of contraction (or expansion) of the piezoelectric materials 24, 24' through the control of the electrical source (not shown). Accordingly, the mounting seat 20 may be displaced axially, rotated or tilted with respect to the aforesaid plane.

The mounting seat 20 is connected to the amplifying levers 16, 16' through the said flexural links 18, 18' such that the mounting seat 20 can follow the motion of the driving part and amplifying levers 16, 16' without introducing large constraints to the driving part and amplifying levers 16, 16'. Hence, the piezoelectric materials 24, 24' are drivable by an electrical signal to impart stress to flex the inclined links 12, 12' and move the saddle-like amplifying structure 14 connected to the inclined links 12, 12'.

Additionally, the device 10 can operate in a sensing mode when a dynamic load is applied on the mounting seat 20. The external force applied and received on the mounting seat 20 is transformed to a global deformation of the piezoelectric device 10 via the flexural links 18, 18', amplifying levers 16, 16' and inclined links 12, 12'. Global deformation of the device involves the application of stress to bend the piezoelectric materials 24, 24' of the driving parts which generates electrical signals that are proportional to the degree of bending of the driving parts. The driving parts thus become the sensing parts for receiving and measuring the external force from the dynamic load acting on the mounting seat 20 in the sensing mode.

It would be apparent that many modifications of the above first preferred embodiment may be implemented without departing from the scope of the concept of this invention. FIGS. 5–9 show some of the possible modifications and configurations of the invention, but they are not meant to be exhaustive.

Figure 5:
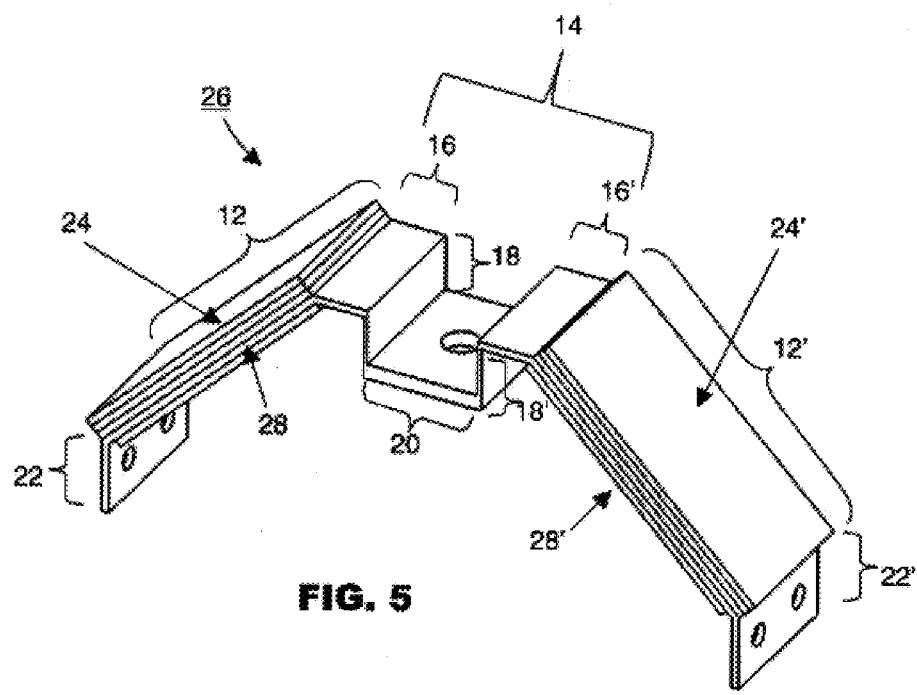
FIG. 5 is a perspective view of a piezoelectric device according to a second preferred embodiment of the present invention.
Figure 6A:
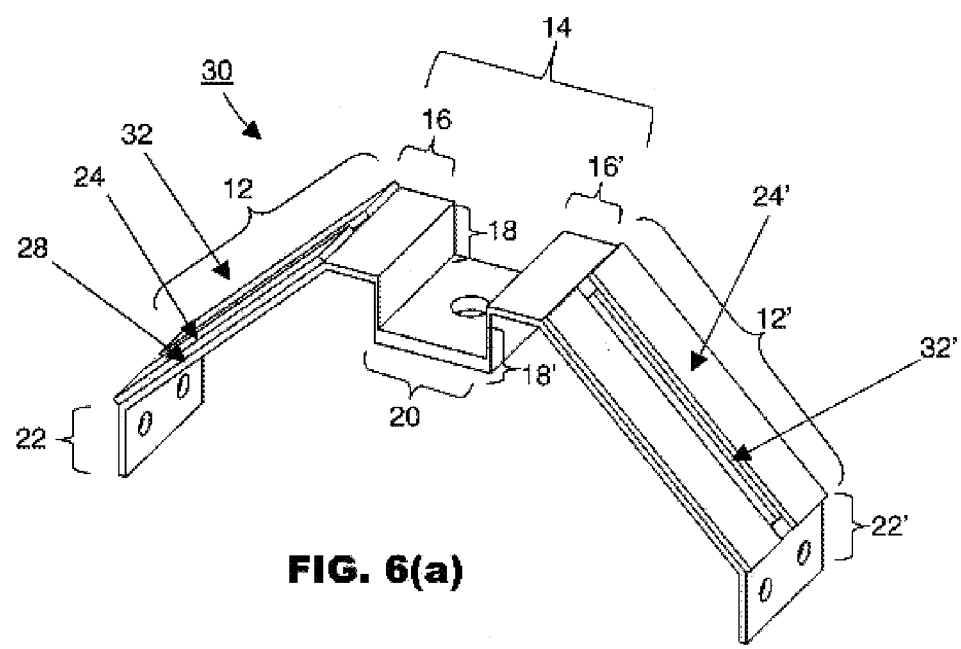
FIG. 6(a) is an isometric view of a piezoelectric device according to a third preferred embodiment of the present invention.
Figure 6B:
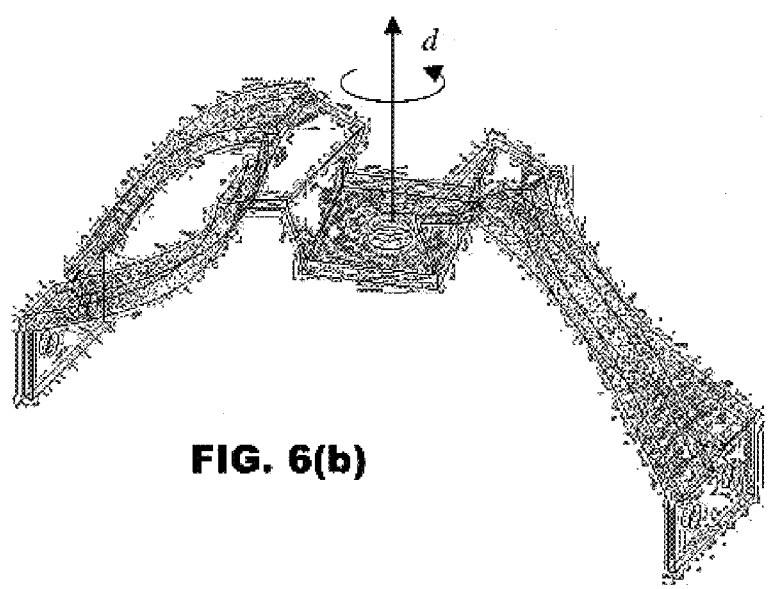
FIGS. 6(b)–6(d) are explanatory views illustrating different operational states of the piezoelectric device according to this embodiment.
Figure 6C:
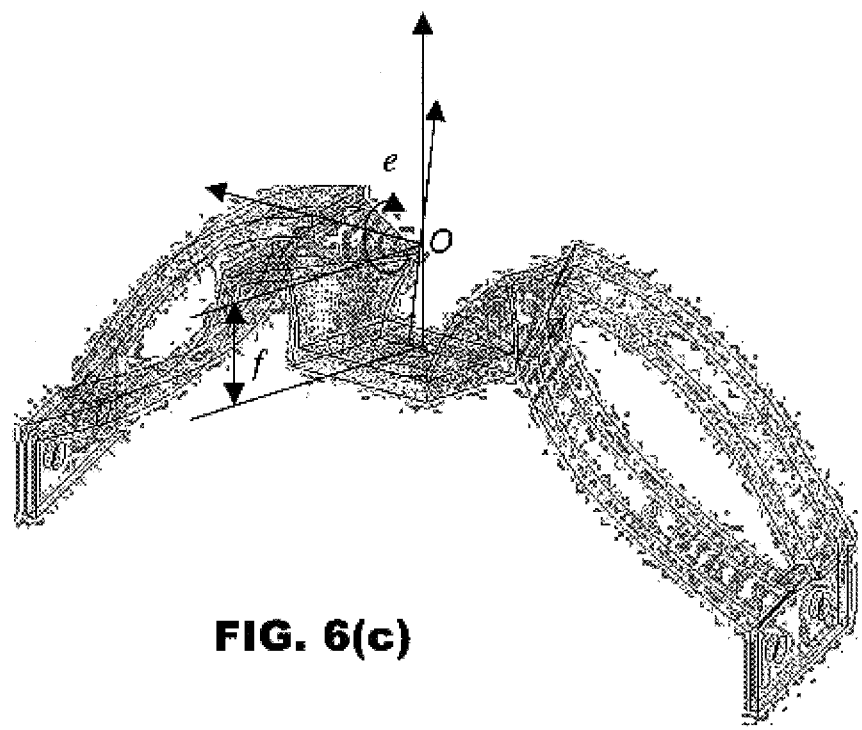
Figure 6D:
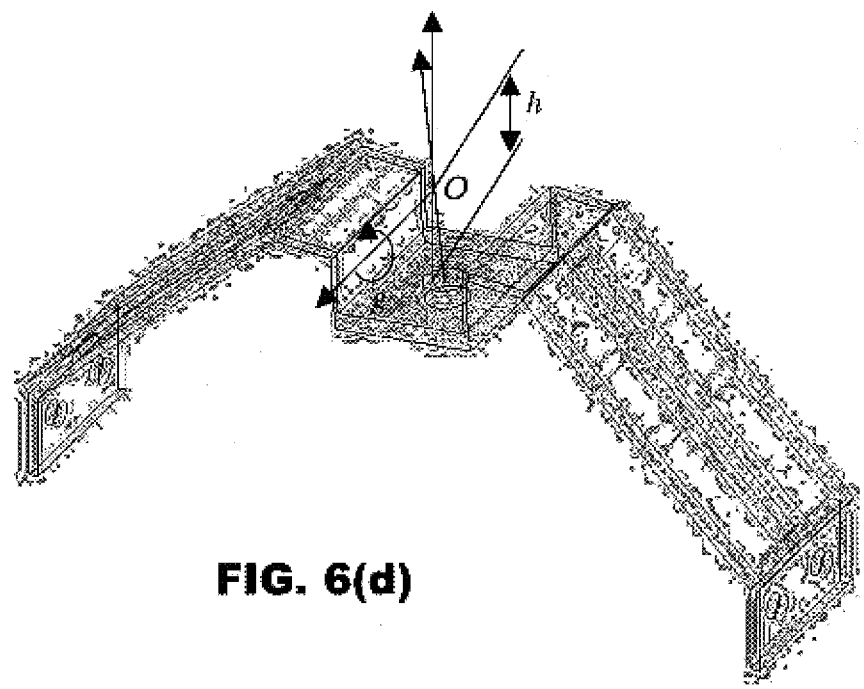
Figure 7A:
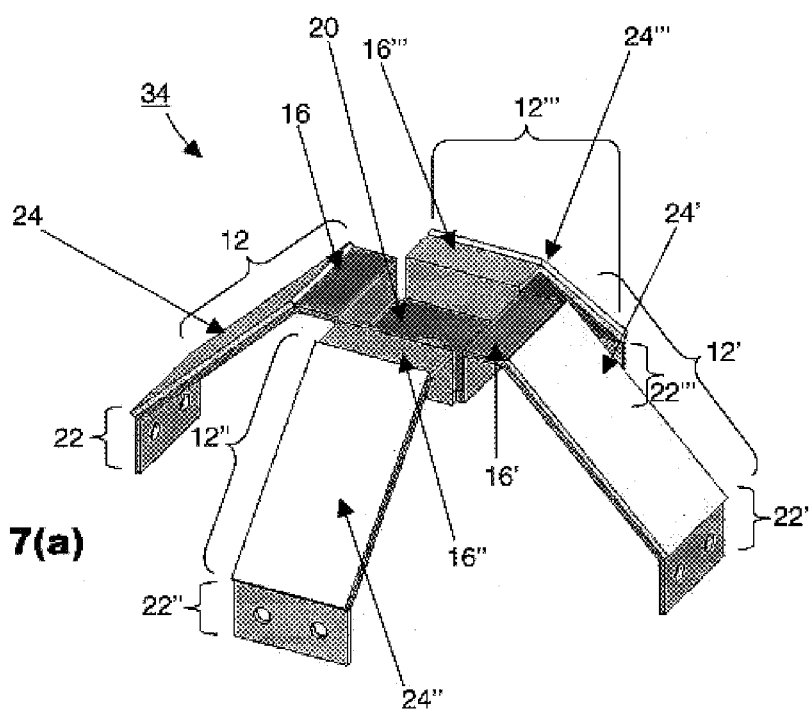
FIG. 7(a) is an isometric view of a piezoelectric device according to a fourth preferred embodiment of the present invention.
Figure 7B:
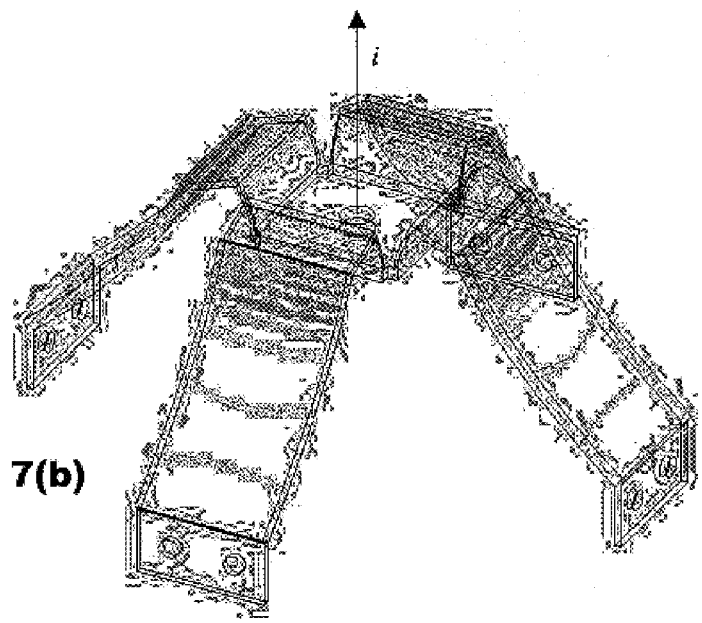
FIGS. 7(b)–7(d) are explanatory views illustrating different operational states of the piezoelectric device according to this embodiment.
Figure 7C:
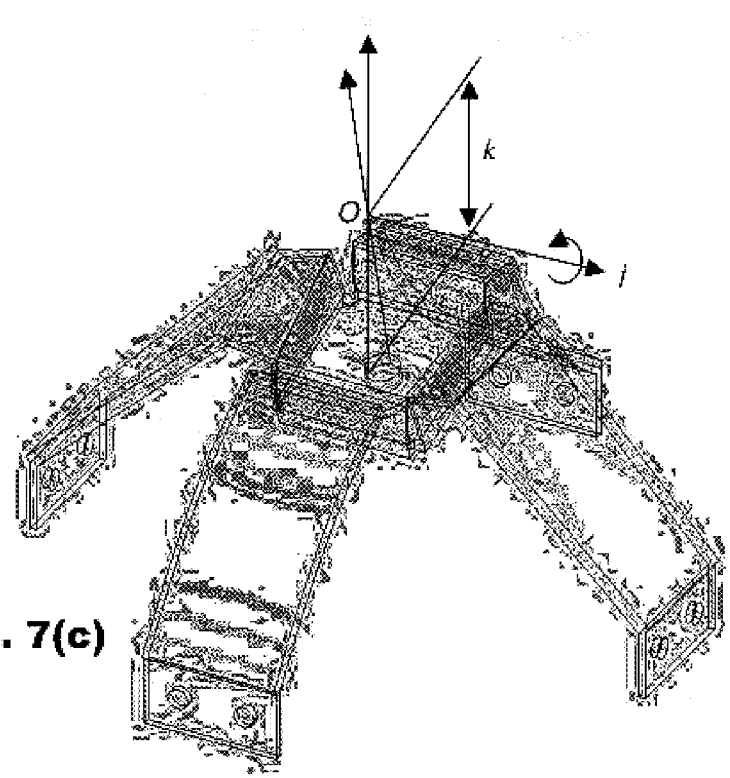
Figure 7D:
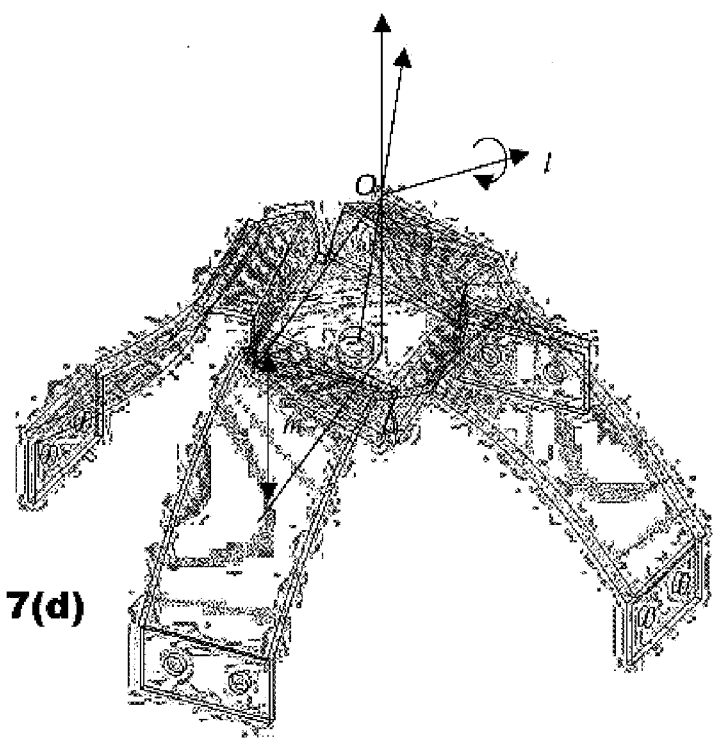

FIG. 5 is a perspective view of a piezoelectric device 26 according to a second preferred embodiment of the present invention. The piezoelectric device 26 has multiple layers of piezoelectric materials 24, 24' bonded onto the inclined links 12, 12'. In the simplest case, one additional layer of piezoelectric materials 24, 24' can be bonded onto the inclined links 12, 12', as compared with the first embodiment. The thickness of the metallic links 28, 28' comprised in the inclined links 12, 12' should match the properties of the piezoelectric materials 24, 24' used in order to achieve the best performance. For example, a piezoelectric material layer of 1 mm thick should be bonded to a metallic link 28 (or 28') of about 1 mm thick if the inclined links 12, 12' are made by folding a single stainless steel strip. The piezoelectric materials 24, 24' may further be mounted onto opposite surfaces of each inclined link 12, 12' as shown in FIG. 5. The performance of the piezoelectric device of the present invention can thus be altered by using different layers of materials bonded onto the outer or inner sides of the inclined links 12, 12'.

FIG. 6(*a*) is an isometric view of a piezoelectric device 30 according to a third preferred embodiment of the present invention, and FIGS. 6(*b*)–6(*d*) are explanatory views illustrating different operational states of the piezoelectric device 30 according to this embodiment. In this embodiment, the inclined links 12, 12' are modified such that when piezoelectric materials 24, 24' are applied on the inclined links 12, 12', the driving part can exert a greater degree of freedom of motion on the amplifying levers 16, 16' and thus the flexural links 18, 18' and mounting seat 20. For example, the middle parts of the inclined links 12, 12' of the piezoelectric device of the present invention can be milled away, leaving an elongated slot at the middle part of each inclined links 12, 12'. The inclined links 12, 12' are divided into two parts, thus forming two bridges 32, 32' connecting the mounting flanges 22, 22' to the amplifying levers 16, 16'. Layers of piezoelectric materials 24, 24' with substantially the same width as the width of the bridges 32, 32' of the inclined links 12, 12' are bonded onto the individual bridges 32, 32' comprising each divided part of the inclined links 12, 12'. Each bridge 32, 32' is independently flexible with respect to an adjacent bridge 32, 32'. When the piezoelectric materials 24, 24' are energized in the same phase, the device 30 can deform in a way that is similar to the devices without slots. When the piezoelectric materials 24, 24' are energized with different phases, the piezoelectric device 30 will be able to achieve a rotation d (as in FIG. 6(*b*)), a tilt e about an origin O that is a distance f from the mounting seat 20 (as in FIG. 6(*c*)) as well as a tilt g about an origin O that is a distance h from the mounting seat 20 (as in FIG. (6(*d*)).

FIG. 7(*a*) is an isometric view of a piezoelectric device 34 according to a fourth preferred embodiment of the present invention, and FIGS. 7(*b*)–7(*d*) are explanatory views illustrating different operational states of the piezoelectric device 34 according to this embodiment. A third flexible platform and a fourth flexible platform in the form of third and fourth inclined links 12", 12''' are connected to the saddle-like amplifying structure 14. Therefore, additional amplifying levers 16", 16''', inclined links 12", 12''' and mounting flanges 22", 22''' can be included to a piezoelectric device that is similar to the piezoelectric device 10 of the first embodiment. These amplifying levers 16", 16''', inclined links 12", 12''' and mounting flanges 22", 22''' are preferably arranged orthogonally to the corresponding components in the piezoelectric device 10 of the first embodiment. In addition to doubling the force output, this orthogonal arrangement can also give the unitary piezoelectric device 34 more actuation degrees of freedom as compared with the piezoelectric device 10 in FIG. 2. For example, when the piezoelectric materials are energized in such a way that all the piezoelectric materials contract, the device 34 deforms to give rise to an increased output stroke i as shown in FIG. 7(*b*). When the piezoelectric materials are energized in such a way that not all the piezoelectric materials contract in the same way, the mounting seat 20 of the device 34 can be made to perform a simple tilting j about an origin O that is at a distance k from the mounting seat 20 (as shown in FIG. 7(*c*)), or a complex tilting/about an origin O that is at a distance m from the mounting seat 20 (as shown in FIG. 7(*d*)).

Figure 8A:
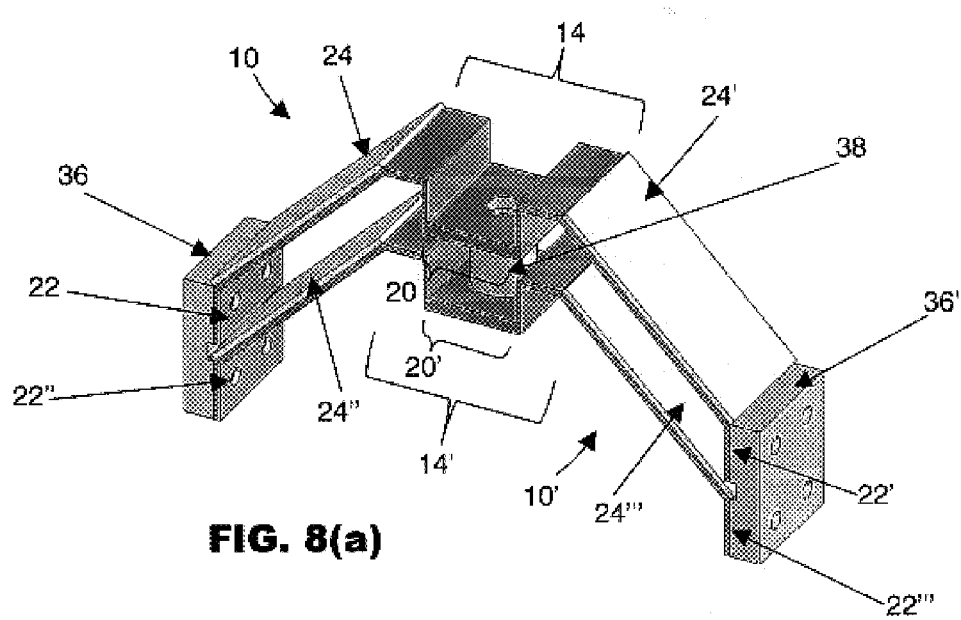
FIG. 8(a) is an isometric view of a piezoelectric device according to a fifth preferred embodiment of the present invention that comprises two piezoelectric devices according to the first preferred embodiment of the invention that are stacked in order to double the force output as compared with FIG. 2.
Figure 8B:
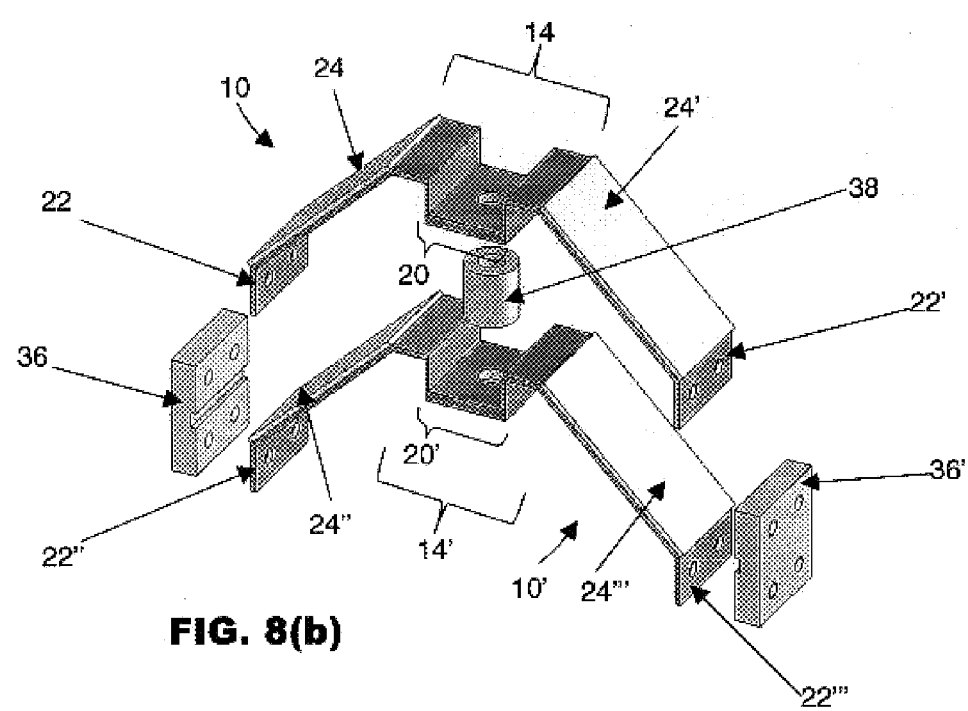
FIG. 8(b) is an exploded view of the stack illustrated in FIG. 8(a)

FIG. 8(*a*) is an isometric view of a piezoelectric device according to a fifth preferred embodiment of the present invention that comprises two piezoelectric devices 10, 10' according to the first preferred embodiment of the invention that are stacked in order to double the force output as compared with FIG. 2. FIG. 8(*b*) is an exploded view of the stack illustrated in FIG. 8(*a*). Two unitary piezoelectric devices 10, 10', each of which is substantially similar to that shown in FIG. 2, can be stacked together with one placed on top of the other and with mounting seats pointing in the same direction. They are coupled to each other and configured to be drivable simultaneously. In this arrangement, the piezoelectric devices 10, 10' are configured to be drivable simultaneously in identical directions to increase the force output. The two devices 10, 10' are connected externally through their mounting flanges 22, 22', 22", 22''' to mounting couplers 36, 36'. They may be coupled using screws (not shown). After mounting the two devices 10, 10' to the mounting couplers 36, 36', the devices 10, 10' are operable to move within the same reference planes that are provided by the mounting couplers 36, 36'. A transmission column 38 is preferably inserted between the mounting seats 20, 20' of the devices 10, 10' such that the mounting seats 20, 20' can move up and down together. The motion direction of the mounting seats 20, 20' is thus the same as that of a single unit, whereas the force output is doubled by combining the driving forces of multiple piezoelectric materials 24, 24', 24", 24'". Multiple stacking of more than two piezoelectric devices is also possible in order to multiply the force output using this configuration.

Figure 9A:
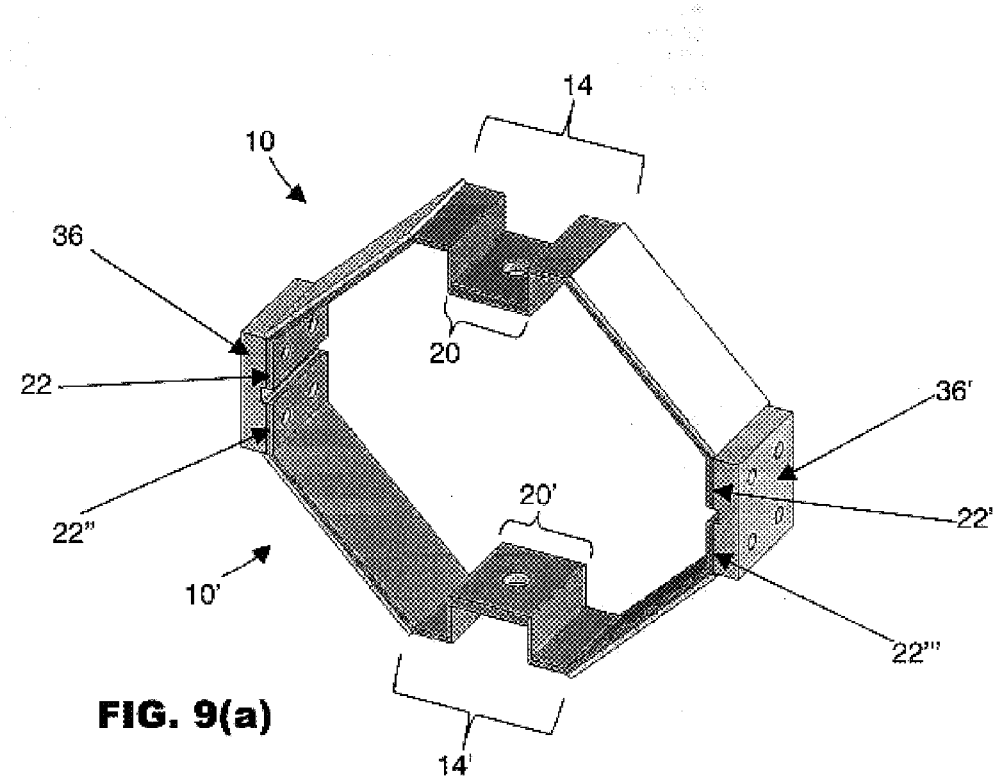
FIG. 9(a) is an isometric view of a piezoelectric device according to a sixth preferred embodiment of the present invention that comprises two piezoelectric devices according to the first preferred embodiment of the invention that are stacked to double the displacement output as compared with FIG. 2.
Figure 9B:
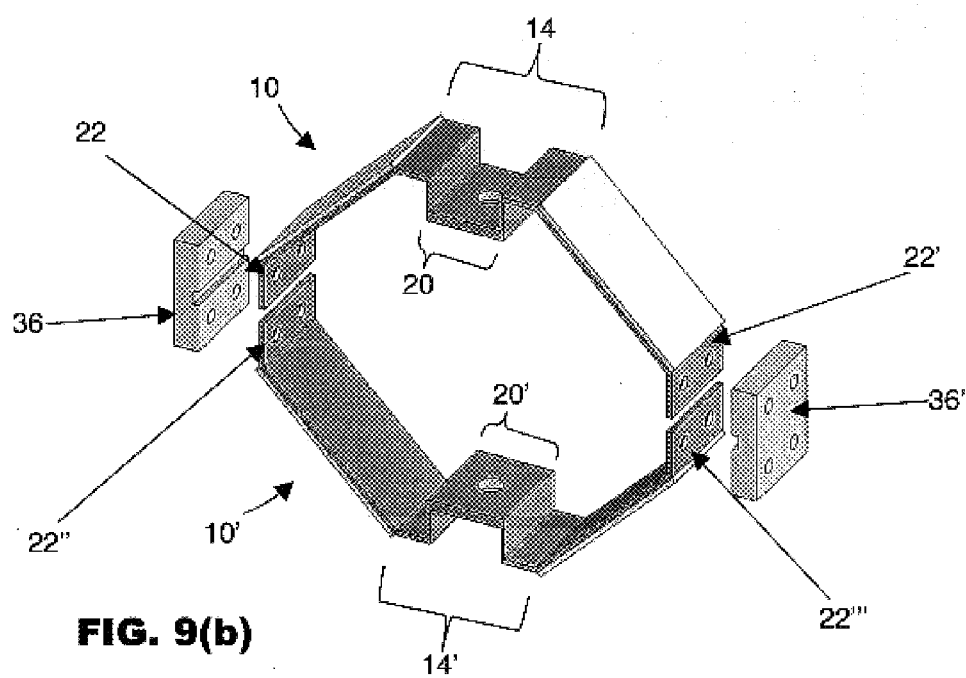
FIG. 9(b) is an exploded view of the stack illustrated in FIGS. 9(a).

FIG. 9(a) is an isometric view of a piezoelectric device according to a sixth preferred embodiment of the present invention that comprises two piezoelectric devices 10, 10' according to the first preferred embodiment of the invention that are stacked to double the displacement output as compared with FIG. 2. FIG. 9(b) is an exploded view of the stack illustrated in FIG. 9(a). In this embodiment, two unitary devices 10, 10', each of which is substantially similar to that described in FIG. 2 can be stacked together, one on top of the other, with their mounting seats 20, 20' pointing in opposite directions. This arrangement contributes to increasing the displacement attainable through movement of the respective mounting seats 20, 20' being driven simultaneously in opposite directions. The two devices 10, 10' are connected externally through their mounting flanges 22, 22', 22", 22'" to mounting couplers 36, 36'. They may be coupled using screws (not shown). After mounting to the mounting couplers 36, 36', the two devices 10, 10' can thus move within the same floating reference planes provided by the mounting couplers 36, 36'.

Figure 9C:
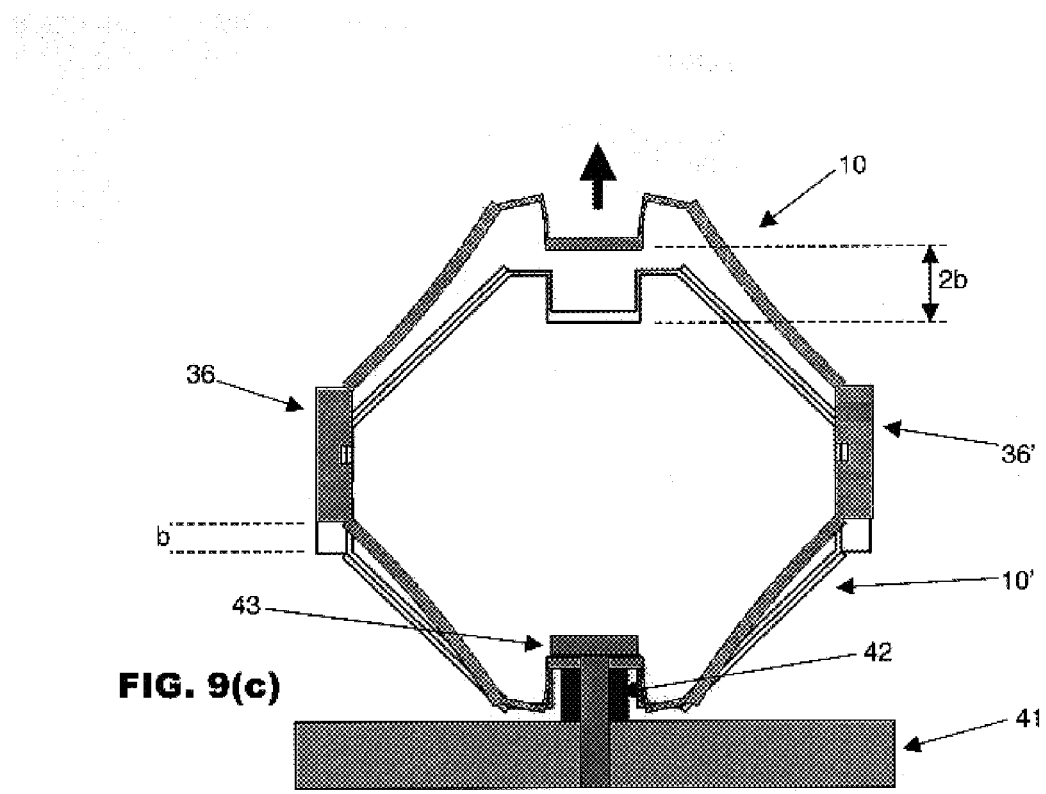
FIG. 9(c)–9(d) are explanatory views illustrating different operational states of the piezoelectric device according to this embodiment.
Figure 9D:
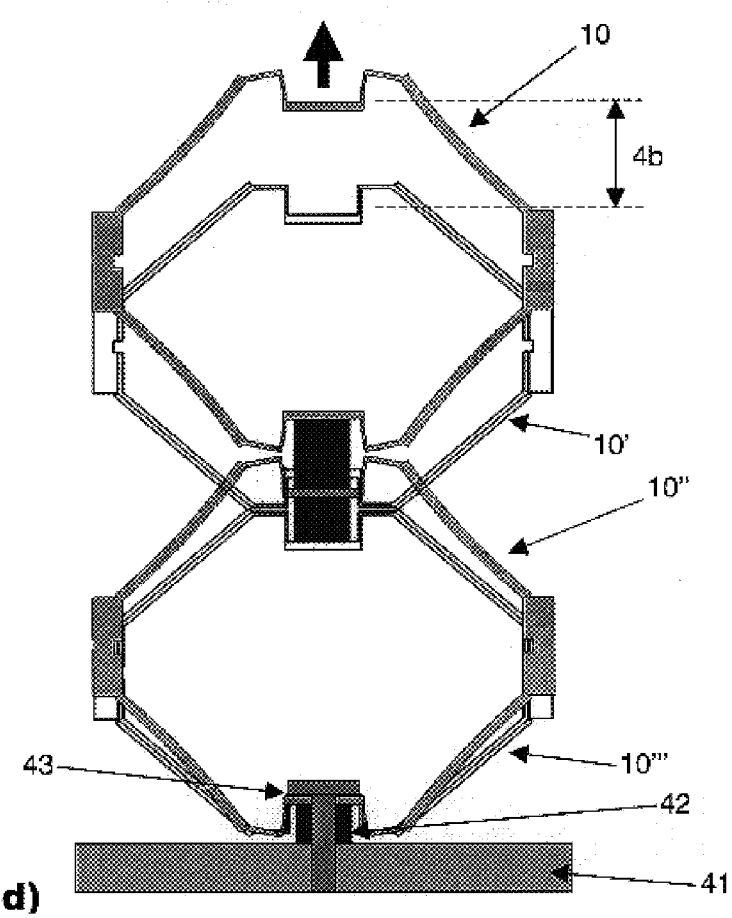

The effect is further illustrated in FIGS. 9(c) and 9(d). In FIG. 9(c), when one end of the mounting seat is fixed on a rigid reference base 41 using a connection ring 42 and a connection bolt 43, the displacement of this configuration of piezoelectric device is doubled (i.e., 2b) as compared with that of the first preferred embodiment. As shown in FIG. 9(d), multiple stacking of more than two piezoelectric devices of this configuration is also possible in order to multiply the displacement using this configuration; that is, the displacement is four times larger than that of the first preferred embodiment (i.e., 4b).

Figure 10:
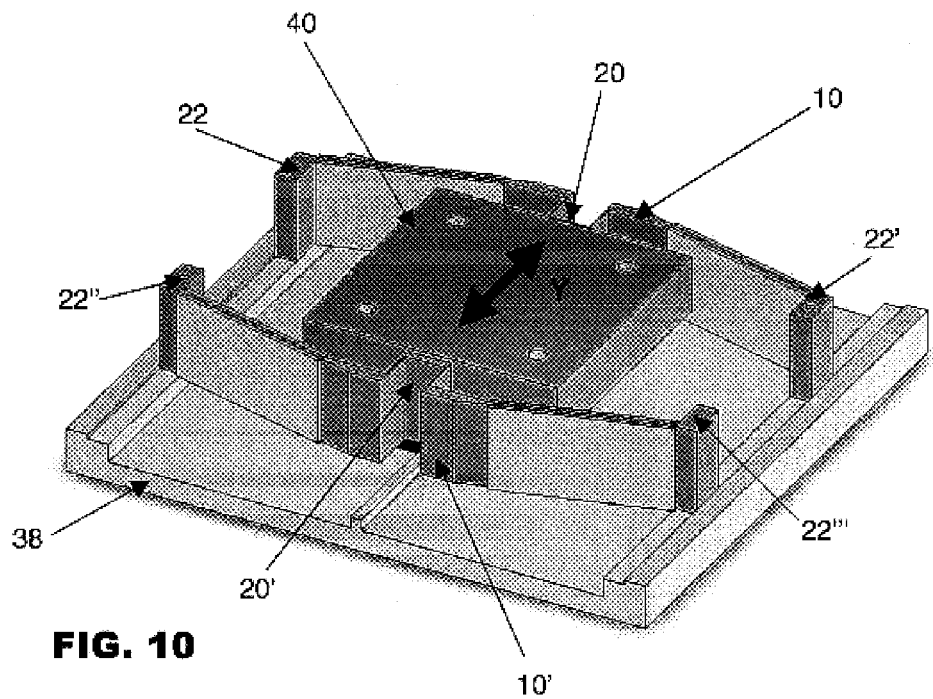
FIG. 10 is an isometric view of a single-axis micropositioning stage incorporating a piezoelectric device according to the sixth preferred embodiment of the invention.

FIG. 10 is an isometric view of a single-axis micropositioning stage incorporating a piezoelectric device according to the aforesaid sixth preferred embodiment of the invention. The piezoelectric device comprises a first piezoelectric device 10 and a second piezoelectric device 10'. The first and second piezoelectric devices 10, 10' are mounted on a rigid metal base 38 by securing their mounting flanges 22, 22' 22", 22'" to the rigid metal base 38. An object, such as worktable 40, is located between the first and second piezoelectric devices 10, 10' and secured to the mounting seats 20, 20' of the first and second piezoelectric devices 10, 10'. Motion of the worktable 40 is actuated by combined driving action of the first and second piezoelectric devices 10, 10', which are configured to move the worktable 40 in the same direction. The worktable 40 is configured to be driven only along a single axis. A position of the worktable 40 at any time may be determinable by a separate linear encoder (not shown).

Figure 11:
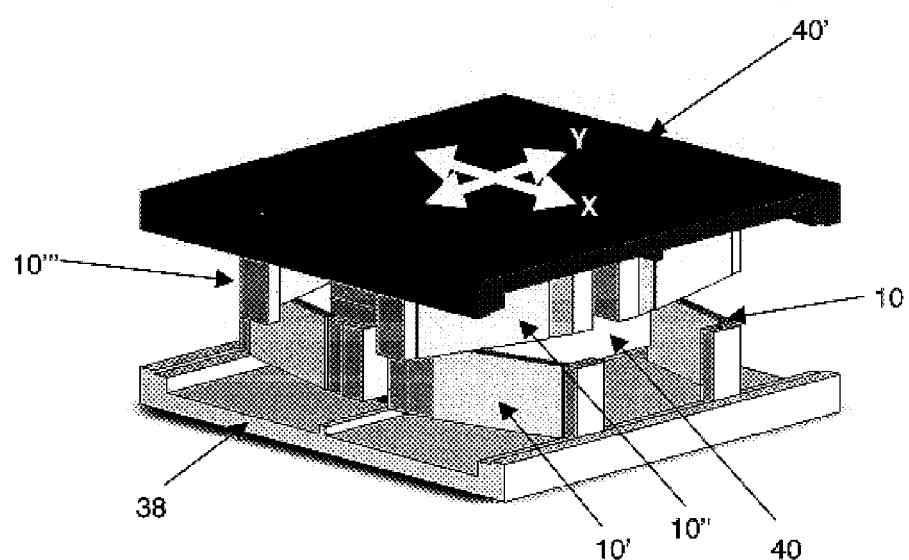
FIG. 11 is an isometric view of a two-axis micropositioning stage incorporating two piezoelectric devices according to the aforesaid sixth preferred embodiment of the invention stacked together in an orthogonal direction.

FIG. 11 is an isometric view of a two-axis micropositioning stage incorporating two piezoelectric devices according to the aforesaid sixth preferred embodiment of the invention stacked together in an orthogonal direction. A lower piezoelectric device comprises a first piezoelectric device 10 and a second piezoelectric device 10'. The lower piezoelectric device is mounted on a rigid metal base 38 by securing its mounting flanges 22, 22', 22", 22'" to the rigid metal base 38. The first worktable 40 is located between the first and second piezoelectric devices 10, 10' and secured to the mounting seats 20, 20' of the lower piezoelectric device (see FIG. 10). Motion of the first worktable 40 is actuated by combined driving action of the first and second piezoelectric devices 10, 10', which are configured to move the first worktable 40 along a first axis or Y direction. An upper piezoelectric device comprises a third piezoelectric device 10" and a fourth piezoelectric device 10'". The upper piezoelectric device is mounted on the first worktable 40 by securing its mounting seats (not shown) on the worktable 40. A second worktable 40' is mounted on the upper piezoelectric device by securing it to the mounting flanges (not shown) of the upper piezoelectric device.

Motion of the second worktable 40' is actuated by combined driving action of the third and fourth piezoelectric devices 10", 10'" on the first worktable 40 causing relative motion between the first worktable 40 and the third and fourth piezoelectric devices along a second axis, or X direction, that is orthogonal to the first axis, or Y direction. This moves the second worktable 40' in the X direction. Therefore, motions of the first and second worktables 40, 40' are actuated by combined driving action of the first, second, third and fourth piezoelectric devices 10, 10', 10", 10'" which are together configured to move the second worktable 40' in the X and Y directions. Positions of the first and second worktables 40, 40' at any time may be determinable by separate linear encoders (not shown).

Besides the actuation applications as specifically described above, the piezoelectric devices can also be used in many other applications. For example, the piezoelectric devices can be used passively as a vibration control device by utilizing its structure that has a low inherent stiffness. It can also be used as a sensor for monitoring loads bearing on the piezoelectric materials through electrical signals generated from the piezoelectric materials bonded on the inclined links.

It would be appreciated that the piezoelectric devices according to the preferred embodiments of the invention are more durable, simpler in design and cheaper to produce than the piezoelectric devices used in prior art high-performance actuators. This is because piezoelectric multilayer stacks, which are fragile and more expensive, do not have to be used to drive the driver parts of these piezoelectric devices.

Further, the saddle-like amplifying structure 14 provides integrated amplification, decoupling and connection functions that former thin layer actuators do not have. As a result, the piezoelectric devices according to the preferred embodiments can achieve different operation modes, such as linear modes, tilting modes and rotation modes in minute micron resolutions. Their modular designs also allow stroke and force amplification by coupling multiple devices together, instead of having to resort to more complex modifications.

The invention described herein is susceptible to variations, modifications and/or additions other than those specifically described and it is to be understood that the invention includes all such variations, modifications and/or additions which fall within the spirit and scope of the above description.

The invention claimed is:

1. Piezoelectric device comprising:
 a mechanical amplifier adapted to produce a displacement output and/or receive a force input;
 a first flexible platform connected to one side of the mechanical amplifier;
 piezoelectric material mounted on the first flexible platform for controllably flexing the first flexible platform;

a second flexible platform connected to another side of the mechanical amplifier; and piezoelectric material mounted to the second flexible platform for controllably flexing the second flexible platform.

2. Piezoelectric device as claimed in claim 1, wherein the first flexible platform and second flexible platform are arranged on opposite sides of the mechanical amplifier and are positioned symmetrically with respect to each other about the mechanical amplifier.

3. Piezoelectric device as claimed in claim 2, including a third flexible platform and a fourth flexible platform connected to the mechanical amplifier, and piezoelectric material mounted on the third and fourth flexible platforms for controllably flexing the third and fourth platforms, wherein each of the third and fourth flexible platforms are arranged orthogonally with respect to the first and second flexible platforms.

4. Piezoelectric device as claimed in claim 1, wherein the flexible platforms are inclined at an oblique angle with respect to the mechanical amplifier.

5. Piezoelectric device as claimed in claim 1, wherein the piezoelectric materials are drivable by an electrical signal to impart stress to flex the first and second flexible platforms and move the mechanical amplifier connected to the first and second flexible platforms.

6. Piezoelectric device as claimed in claim 1, wherein an external force is receivable by the mechanical amplifier so as to deform the first and second flexible platforms and apply stress on the piezoelectric materials, whereby the piezoelectric materials are responsive to said stress to generate electrical signals through which said external force is measurable.

7. Piezoelectric device as claimed in claim 1, wherein the mechanical amplifier comprises amplifying levers connected to the flexible platforms, a central seat adapted to deliver a displacement output and/or receive a force input, and flexural links linking the amplifying levers to the central seat.

8. Piezoelectric device as claimed in claim 7, wherein the amplifying levers are arranged substantially orthogonally to the flexural links, and the flexural links are arranged substantially orthogonally to the central seat.

9. Piezoelectric device as claimed in claim 7, including mounting means located on the central seat.

10. Piezoelectric device as claimed in claim 1, wherein the mechanical amplifier consists of a monolithic high-strength metallic material.

11. Piezoelectric device as claimed in claim 10, wherein the mechanical amplifier is made from a material selected from the group consisting of: stainless steels, titanium alloys and aluminum alloys.

12. Piezoelectric device as claimed in claim 10, wherein the flexible platforms are formed from the same piece of monolithic high-strength metallic material comprising the mechanical amplifier.

13. Piezoelectric device as claimed in claim 1, including mounting flanges located on a side of the first flexible platform and on a side of the second flexible platform for mounting the piezoelectric device to a structure.

14. Piezoelectric device as claimed in claim 1, wherein the mechanical amplifier includes a central portion that is located on a plane, and energizing the piezoelectric materials is operative to selectively move the central portion to displace it axially, rotate it and tilt it with respect to the plane.

15. Piezoelectric device as claimed in claim 1, including multiple layers of piezoelectric material mounted onto the flexible platforms.

16. Piezoelectric device as claimed in claim 15, wherein the multiple layers of piezoelectric material are mounted onto opposite surfaces of each flexible platform.

17. Piezoelectric device as claimed in claim 1, wherein a central portion of each of the first and second flexible platforms comprises an elongated slot dividing each flexible platform, and each divided part of each flexible platform is adapted to individually mount piezoelectric material and is independently flexible with respect to an adjacent divided part of the flexible platform.

18. Piezoelectric device as claimed in claim 1, including another piezoelectric device that is substantially similar to said piezoelectric device and coupled to the piezoelectric device, wherein both piezoelectric devices are configured to be drivable simultaneously.

19. Piezoelectric device as claimed in claim 18, wherein the mechanical amplifiers of the piezoelectric devices are configured to be drivable simultaneously in identical directions for increasing force output.

20. Piezoelectric device as claimed in claim 19, further comprising a transmission column inserted between the mechanical amplifiers of both piezoelectric devices.

21. Piezoelectric device as claimed in claim 18, wherein the mechanical amplifiers of the piezoelectric devices are configured to be drivable simultaneously in opposite directions for increasing displacement output.

22. Piezoelectric device as claimed in claim 18, including an object coupled between the two piezoelectric devices to the mechanical amplifiers of the piezoelectric devices whereby the piezoelectric devices are configured to drive the object along a first axis.

23. Piezoelectric device as claimed in claim 22, further comprising a third piezoelectric device and a fourth piezoelectric device arranged such that the object is coupled between the third and fourth piezoelectric devices to the mechanical amplifiers of the third and fourth piezoelectric devices, whereby the third and fourth piezoelectric devices are configured to drive the object relative to the third and fourth piezoelectric devices along a second axis that is orthogonal to the first axis.

* * * * *